United States Patent [19]

Glass

[11] 4,292,119
[45] Sep. 29, 1981

[54] GROWTH OF SINGLE-CRYSTAL $2PbO.Fe_2O_3$

[75] Inventor: Howard L. Glass, Orange, Calif.

[73] Assignee: Rockwell International Corporation, El Segundo, Calif.

[21] Appl. No.: 168,928

[22] Filed: Jul. 15, 1980

[51] Int. Cl.³ .............................................. C30B 19/04
[52] U.S. Cl. .................................... 156/624; 252/364; 423/594; 156/DIG. 74
[58] Field of Search ........ 156/624, DIG. 3, DIG. 74, 156/DIG. 85, DIG. 86; 252/364; 423/594, 619, 621, DIG. 12

[56] References Cited

PUBLICATIONS

Jonker, Journal of Crystal Growth, 28 (1975), pp. 231–239.

Mountvala et al., Journal of the American Ceramic Society, vol. 45, No. 6, pp. 285–288.

Nielson et al., J. Phys. Chem. Solids, 1958, vol. 5, pp. 202–207.

Blank et al., Journal of Crystal Growth, vol. 17, (1972), 302–311.

IBM Technical Disclosure Bulletin, vol. 16, No. 9, Feb. 1974, Giess et al.

Primary Examiner—Hiram Bernstein
Attorney, Agent, or Firm—H. Fredrick Hamann; Gilbert H. Friedman

[57] ABSTRACT

Single crystal $2PbO.Fe_2O_3$ is grown from a fluxed melt having a selected concentration ratio of boron oxide to lead oxide and a selected concentration of iron oxide sufficient to cause $2PbO.Fe_2O_3$ to crystallize yet not so much iron oxide as will cause other phases to crystallize.

5 Claims, No Drawings

GROWTH OF SINGLE-CRYSTAL $2PbO \cdot Fe_2O_3$

The invention described herein was made in the course of or under a contract or a subcontract thereunder with the Air Force.

BACKGROUND OF THE INVENTION

1. Field of the Invention

This invention relates to the growth of single-crystal $2PbO \cdot Fe_2O_3$.

2. References

Nielsen et al., "The Growth of Single Crystals of Magnetic Garnets", J. Phys. Chem. Solids, 1958, Pergamon Press, Vol. 5, pp. 202–207.

Blank et al., "The Growth of Magnetic Garnets by Liquid Phase Epitaxy", Journal of Crystal Growth, 1972, North-Holland Publishing Co., Vol. 17, pp. 302–311.

Jonker, "Investigation of the Phase Diagram of the System $PbO-B_2O_3-Y_2O_3$ for the Growth of Single Crystals of $Y_3Fe_5O_{12}$", Journal of Crystal Growth, 1975, North-Holland Publishing Co., Vol. 28, pp. 231–239.

Mountvala et al., "Phase Relations and Structures in the system $PbO-Fe_2O_3$", Journal of the American Ceramic Society, 1962, Vol. 45, No. 6, pp. 285–288.

All of the above-listed references are hereby incorporated by reference into this specification in their entirety.

3. Description of the Prior Art $2PbO \cdot Fe_2O_3$ is a ferrite. Ferrites are widely used in a variety of magnetic, magneto-electronic and magneto-optical devices. In many devices it is advantageous or even necessary that the ferrite be in single-crystal form. Nielsen et al., Blank et al. and Jonker describe the growth of single crystals of certain ferrites including a lead ferrite known as magnetoplumbite having the chemical formula $PbO \cdot 6Fe_2O_3$.

In Nielsen et al., it is shown that bulk single crystals of magnetoplumbite can be grown at relatively high temperatures from a fluxed melt consisting of lead oxide (PbO), iron oxide ($Fe_2O_3$) and a rare-earth oxide or yttrium oxide. Nielsen et al. used the crystal growth method known as "slow cooling". Their fluxed melts were held at a high temperature of from 1300° C. to 1370° C. for a few hours and then were slowly cooled at rates of from one to five degrees Celsius per hour until the desired final temperatures were reached. In some cases, the final temperature was less than 1000° C. However, in all cases, crystallization initiated at temperatures much higher than 1000° C. and all, or very nearly all, crystal growth occurred at temperatures above 1000° C. Moreover, in all cases in which magnetoplumbite crystals were obtained, YIG also crystallized. Thus, magnetoplumbite was not obtained as a single phase.

In their FIG. 7, Nielsen et al. presented a partial phase diagram suggested for the system $PbO-Y_2O_3-Fe_2O_3$ which shows a range of fluxed melt compositions from which, it is suggested, magnetoplumbite can be grown. They indicate that, because of the small amount of data obtained by them and other uncertainties in their determination, their phase diagram should be considered only "semiquantitative".

In Blank et al., it is intimated that the diagram of Nielsen et al. is valid, at least in its general features, for $PbO-B_2O_3$ fluxes. Blank et al. were interested in growing magnetic garnets by liquid phase epitaxy, which primarily entails crystallization at temperatures below 1000° C. The Blank et al. version of the Nielsen et al. diagram includes a line labeled 1300° C. and another line labeled 950° C. The Blank et al. diagram hints at the possibility of forming single-crystal magnetoplumbite at temperatures between these two values. However, there is no discussion or description in the Blank et al. paper of these features of their phase diagram, nor is any data on magnetoplumbite crystallization presented. In fact, Blank et al. reported "no evidence of magnetoplumbite" even when the rare earth oxide ($Y_2O_3$) concentration in their melt was very low. Thus the lines marked 1300° C. and 950° C. appear to have been intended to apply only to crystallization of the garnet phase. Blank et al. imply that adding boron oxide to the fluxed melt of Nielsen et al. does not significantly change the conditions under which magnetoplumbite forms.

Jonker reported on a more detailed investigation of the $PbO-B_2O_3-Fe_2O_3-Y_2O_3$ system for the growth of single-crystal YIG at temperatures in excess of 1000° C. He studied fluxes of three different compositions distinguished by changing their $B_2O_3$:PbO molar ratios from 0.0:1 to approximately 0.1:1 to approximately 0.2:1. Included in Jonker's study were a few data points for compositions which contained no yttrium oxide ($Y_2O_3$). Jonker's crystal growth method was essentially the same slow cooling method as was used by Nielsen et al. as discussed above. Jonker used two different temperature ranges. One range started at 1275° C. with slow cooling to a final temperature of 1000° C. Jonker shows phase diagrams having lines labeled 1000° C. and other lines labeled 1100° C. These labels refer to the final temperatures of crystal growth runs. The temperature at which crystallization initiated must have been much higher. A third line in Jonkers phase diagrams is labeled 1200° C. This line is only estimate.

In addition to the crystal growth data presented, Jonker reports differential thermal analysis (DTA) data. DTA was carried out on samples of the $PbO-B_2O_3$ fluxes containing $Fe_2O_3$ in concentrations ranging from zero to 50 mole percent in steps of ten mole percent. The DTA samples did not contain any yttrium oxide. In presenting the DTA results, Jonker defines the composition range "relevant to bulk flux growth" as $Fe_2O_3$ concentrations in the range from 20 to 50 mole percent. He further states that this composition range corresponds "to a single primary field, namely that of $PbFe_{12}O_{19}$". However, Jonker does not indicate how or whether he determined that $PbFe_{12}O_{19}$, equivalent to $PbO \cdot 6Fe_2O_3$ magnetoplumbite, actually formed. The work of Mountvala et al., as discussed below, contradicts this conclusion by Jonker. Moreover, under the experimental conditions of DTA, phases are expected to crystallize in a ceramic or polycrystalline form rather than as single crystals.

If Jonker's DTA results could be applied to single-crystal growth, then it would appear that crystallization of magnetoplumbite at temperatures below 1000° C. would be possible by using a melt having $Fe_2O_3$ concentrations near 20 mole percent. For example, based upon Jonker's FIG. 1, using $Fe_2O_3$ in a concentration of 20 mole percent and a lead oxide flux containing no boron oxide, the liquidus temperature would be 865° C. Presumably, this is the temperature at which crystallization would initiate. This result is apparently correct; but the crystallizing phase at this temperature cannot be magnetoplumbite! In this connection, see Mountvala et al., referenced above. That the crystallizing phase under the conditions set forth above cannot be magnetoplumbite is shown by the phase diagram of Mountvala et al., for the $PbO\text{-}Fe_2O_3$ system. The work of Mountvala et al., based on investigation of polycrystalline, ceramic materials, shows that there are three Pb-Fe-oxides. Besides the magnetoplumbite which Mountvala et al. denote as the $\beta$-phase, there are $\gamma$- and $\delta$-phases.

The $\delta$-phase has the composition $2PbO.Fe_2O_3$; the $\gamma$-phase is $PbO.2Fe_2O_3$ with a capacity to form solid solutions up to $PbO.2\frac{1}{2}Fe_2O_3$; the magnetoplumbite $\beta$-phase is $PbO.6Fe_2O_3$ with a capacity to form solid solutions up to $PbO.5Fe_2O_3$. It is clear from the phase diagram of Mountvala et al. that crystallization from $PbO\text{-}Fe_2O_3$ melts at temperatures below 910° C. must result in the formation of $\delta$-phase (or the formation of PbO if the $Fe_2O_3$ concentration is less than about 18 mole percent). Similarly, in the temperature range from 910° C. to 945° C., $\gamma$-phase will crystallize. If the work of Mountvala et al. is to be accepted, only at temperatures above 945° C. can magnetoplumbite crystallize. Therefore, Jonker's statement that his DTA results for 20 mole percent $Fe_2O_3$ in PbO correspond to crystallization of magnetoplumbite must be wrong. In addition, there must be serious doubts about the validity of Jonker's statement for the other data points at 20 mole percent $Fe_2O_3$, especially for the $B_2O_3$:PbO molar ratio of 0.1 for which Jonker's liquidus temperature is 930° C.

It should be noted, as well, that none of the single-crystal prior art references (Nielsen et al., Blank et al. and Jonker) mentions any of the Pb-Fe-oxide phases other than magnetoplumbite. The other phases, $\gamma$ and $\delta$ were omitted by them since these phases do not exist at the high temperatures, greater than 1000° C., employed in their work. Similarly, PbO is not expected to crystallize at temperatures greater than 1000° C.; so crystallization of PbO is not mentioned.

In summary, the prior are indicates that single crystals of magnetoplumbite, $PbO.6Fe_2O_3$, can be grown by slow cooling from a PbO or $PbO\text{-}B_2O_3$ flux at temperatures above 1000° C. Nothing in the prior art teaches single crystal growth of other lead ferrites such as $2PbO.Fe_2O_3$. The prior art shows that ceramic, polycrystalline, $2PbO.Fe_2O_3$ can be prepared by reacting mixtures of PbO and $Fe_2O_3$ powders. These results for ceramic materials suggest that $2PbO.Fe_2O_3$ single-crystals could be grown from melts comprising PbO and $Fe_2O_3$ where the $Fe_2O_3$ concentration ranges from about 18 mole percent to about 23 mole percent. Crystal growth by such a process would constitute growth from a PbO flux. However, nothing in the prior art teaches the growth of single-crystal $2PbO.Fe_2O_3$ from a $PbO\text{-}B_2O_3$ flux.

The technique suggested by the prior art for growing single-crystal $2PbO.Fe_2O_3$ from a PbO flux has certain limitations. Some of these limitations are due to the relatively high volatility of lead oxide. This creates problems since lead oxide vapors are both toxic and corrosive. Moreover, continuous evaporation of lead oxide makes it difficult to control crystal growth. The standard method of the prior art to deal with the problem of evaporation of lead oxide is to use sealed crucibles. However, sealed crucibles make it difficult to carry out seeded growth and to observe the crystallization.

There is a need, therefore, to provide a crystal growth technique which reduces evaporation of lead oxide.

SUMMARY OF THE INVENTION

By means of this invention, the above-noted shortcomings of the prior art are overcome. The invention provides a $PbO\text{-}B_2O_3$ fluxed melt for which evaporation of PbO is so low that crystal growth may be carried out in a crucible which is open to the air. This facilitates the introduction of seed crystals or other preferred sites for initiation of crystal growth. This also facilitates the determination of the optimum temperature for crystallization.

In a preferred embodiment, there is provided a fluxed melt for growing single-crystal $2PbO.Fe_2O_3$, comprising boron oxide ($B_2O_3$), lead oxide (PbO), and iron oxide ($Fe_2O_3$). The mole ratio of boron oxide to lead oxide in the melt is at least about 0.06.

The concentration of iron oxide is at least about 9.8 mole percent and not more than about 14.8 mole percent. This fluxed melt yields single-crystals of $2PbO.Fe_2O_3$.

DETAILED DESCRIPTION

Example I

A melt was prepared having the following composition: 86.5 mole percent PbO, 5.5 mole percent $B_2O_3$, 8.0 mole percent $Fe_2O_3$. The molar ratio $B_2O_3$:PbO is thus 0.064:1. The concentration of iron oxide is relatively low. The mixed starting materials were loaded into an open (unsealed) platinum crucible and held for about sixteen hours (overnight) at a temperature of approximately 950° C. The materials were in a molten state at this temperature. The temperature was increased to approximately 1000° C. and the melt was held at this temperature for one hour to assure complete dissolution of solids and to assure homogeneity. It was not considered necessary to go to a higher temperature to assure complete dissolution because of the relatively low concentration of iron oxide. The furnace temperature was then reduced to 900° C. A clean platinum wire was inserted into the melt to serve as a nucleation site for crystallization. While the surface of the melt was observed for evidence of crystallization, the furnace temperature was lowered in several discrete steps.

At a temperature of 743° C., no evidence of crystallization had been observed. When the furnace temperature was lowered to 718° C., the melt froze. The temperature was raised to 733° C. and the melt again became liquid. The temperature was then lowered again. With the temperature in the range from 728° C. to 733° C., crystallization occurred on the platinum wire. Standard x-ray diffraction methods showed the crystals to be lead oxide (PbO). This example confirms the phase diagram of Mountvala et al, by showing that, at relatively low concentrations of iron oxide, the phase which crystallizes is lead oxide (PbO). The flux composition of this example is therefore not suitable for growing single-crystal $2PbO.Fe_2O_3$.

Example II

Iron oxide ($Fe_2O_3$) powder was added to the melt of Example I to increase the iron oxide concentration thereof, in steps, to values of 9.8, 11.5, 13.2 and 14.8 mole percent. After each respective addition, the temperature was increased to assure complete dissolution of all solid phases. The temperature was then lowered until crystals, formed by spontaneous nucleation, were observed on the melt surface or on a platinum wire. It was found that the temperature of crystallization, which approximates but is less than the saturation temperature, increased in proportion to the iron oxide concentration and reached a level of 793° C. for the case of 14.8 mole percent iron oxide concentration. In each case, samples of the spontaneously nucleated crystals were removed from the melt surface on a platinum wire loop. The crystals were found to be non-magnetic. The crystal morphology was not distinct, but tetragonal or orthorhombic features were seen. X-ray diffraction showed the crystals to be $2PbO \cdot Fe_2O_3$, the δ-phase. An X-ray Laue pattern obtained from a large face of one of the crystals grown from the 14.8 mole percent melt showed an array of spots characteristic of a single crystal. The symmetry of the spots indicated the existence of a 4-fold symmetry axis normal to the crystal face.

This example shows that, as expected from the phase diagram of Mountvala et al. for some range of iron oxide concentration, the phase which crystallizes is $2PbO \cdot Fe_2O_3$, the δ-phase. However, for the particular values of iron-oxide concentration used in this example, that phase diagram indicates that lead oxide should crystallize. The absence of crystalline lead oxide in these results is unexpected. This deviation is believed to be due to the presence of the boron oxide in the melt. It is believed that the boron tends to keep the lead oxide in solution favoring crystallization of iron-rich phases and inhibiting the crystallization of lead-rich phases.

Example III

Iron oxide powder was added to the melt of Examples I and II to further increase the iron oxide concentration thereof, in discrete steps, to 16.3 mole percent and 17.6 mole percent, respectively. After each addition, the temperature was increased to assure complete dissolution of all solid phases.

Then the temperature was lowered until crystals, formed by spontaneous nucleation, were observed on the melt surface. As before, the temperature of crystallization was found to increase with increasing iron oxide concentration.

In the case of 17.6 mole percent concentration of iron oxide, the temperature of crystallization was observed to be 883° C. In each case, samples of the spontaneously nucleated crystals were removed from the melt surface on a platinum wire loop. The crystals were found to be magnetic. The crystal morphology was hexagonal. X-ray diffraction showed the crystals to be magnetoplumbite, $PbO \cdot 6Fe_2O_3$, the δ-phase. The X-ray diffraction data showed a few, weak extra peaks. The origin of these peaks could not be determined conclusively. However, they are consistent with the presence of a small amount of γ-phase, $PbO \cdot 2Fe_2O_3$. These examples show, as expected from the phase diagram of Mountvala et al., that magnetoplumbite can be crystallized if the iron oxide concentration is sufficiently high. Moreover, if the γ-phase was in fact present, the results show, as expected from the Mountvala et al. phase diagram, the γ-phase crystallizes for iron oxide concentrations slightly higher than those for which δ-phase crystallizes. However, for the particular values of iron oxide concentration of this example, the Mountvala et al. phase diagram indicates that lead oxide should crystallize. The absence of crystalline lead oxide in these results is unexpected. It is believed to be due to the presence of the boron oxide in the melt for the same reason discussed in the example above.

Example IV

The iron oxide concentration of the melt of Examples I, II and III was further increased, by the addition of iron oxide powder, to a value of 19.1 mole percent. The temperature was increased to assure complete dissolution of all solid phases. Then the temperature was lowered until crystals, formed by spontaneous nucleation, were observed on the melt surface. The temperature of crystallization was 933° C. Samples of the spontaneously nucleated crystals were removed from the melt surface on a platinum wire loop. The crystals were found to be magnetic. The crystal morphology was hexagonal. X-ray diffraction showed the crystals to be magnetoplumbite, $PbO \cdot 6Fe_2O_3$, the β-phase. No extra peaks were found in the X-ray data. This xample shows, as expected from the Mountvala et al. phase diagram, that magnetoplumbite will crystallize if the iron oxide concentration is increased to a sufficiently high value. However, for the actual value of iron oxide concentration in the melt of this example, the Mountvala et al. phase diagram indicates that either lead oxide or the δ-phase should also crystallize. This unexpected result is believed to be due to the presence of the boron oxide in the melt for the reason discussed in Example II.

While the invention has been shown and described with reference to certain preferred embodiments thereof, it will be understood by those skilled in the art that various changes in details may be made therein without departing from the spirit and scope of the invention as set forth in the following claims.

What is claimed is:
1. A fluxed melt for growing single-crystal $2PbO \cdot Fe_2O_3$, comprising:
    boron oxide ($B_2O_3$);
    lead oxide (PbO); and
    iron oxide ($Fe_2O_3$);
    wherein the mole ratio of boron oxide to lead oxide in said melt is at least about 0.06;
    wherein the concentration of iron oxide in said melt is at least about 9.8 mole percent and not more than about 14.8 mole percent.
2. Single-crystal $2PbO-Fe_2O_3$ grown from the fluxed melt set forth in Claim 1 by spontaneous nucleation, by growth on a seed crystal, or by growth on a single-crystal substrate placed in contact with said melt.
3. A method of growing single-crystal $2PbO \cdot Fe_2O_3$, comprising the steps of:
    forming a fluxed melt comprising boron oxide ($B_2O_3$), lead oxide (PbO) and iron oxide ($Fe_2O_3$), wherein the mole ratio of boron oxide to lead oxide in said melt is at least about 0.06, wherein the concentration of iron oxide in said melt is at least about 9.8 mole percent, and wherein the concentration of iron oxide in said melt is limited to less than about 14.8 mole percent; and
    cooling said fluxed melt to a temperature below 1000° C., whereby said flux will be in a supersaturated state capable of supporting the growth of single crystals of $2PbO \cdot Fe_2O_3$ by spontaneous nucleation, by growth on seed crystal, and by growth on a single-crystal substrate placed in contact with said melt.
4. The method recited in claim 3, further comprising the step of:
    growing single crystal $2PbO \cdot Fe_2O_3$ in an open container for said melt.
5. Single-crystal $2PbO \cdot Fe_2O_3$ formed according to the method set forth in claim 3 or 4 by spontaneous nucleation, by growth on a seed crystal, or by growth on a single-crystal substrate placed in contact with said melt.

* * * * *

Disclaimer 4,292,119.—*Howard L. Glass,* Orange, Calif. GROWTH OF SINGLE-CRYSTAL 2PBO.$Fe_2O_3$. Patent dated Sept. 29, 1981. Disclaimer filed Mar. 18, 1985, by the assignee, *Rockwell International Corp.*

Hereby enters this disclaimer to claim 1 of said patent.

[*Official Gazette April 30, 1985.*]